CAPACITOR MATRIX

Filed May 29, 1961 2 Sheets-Sheet 1

*INVENTORS*
IVARS G. AKMENKALNS
JAMES A. McDONNELL

BY Leo J. Aubel
*ATTORNEY*

United States Patent Office 3,077,591

Patented Feb. 12, 1963

3,077,591
CAPACITOR MATRIX

Ivars G. Akmenkalns, Endicott, and James A. McDonnell, Binghamton, N.Y., assignors to International Business Machines Corporation, New York, N.Y., a corporation of New York Filed May 29, 1961, Ser. No. 113,386
6 Claims. (Cl. 340—347)

Figure 1:
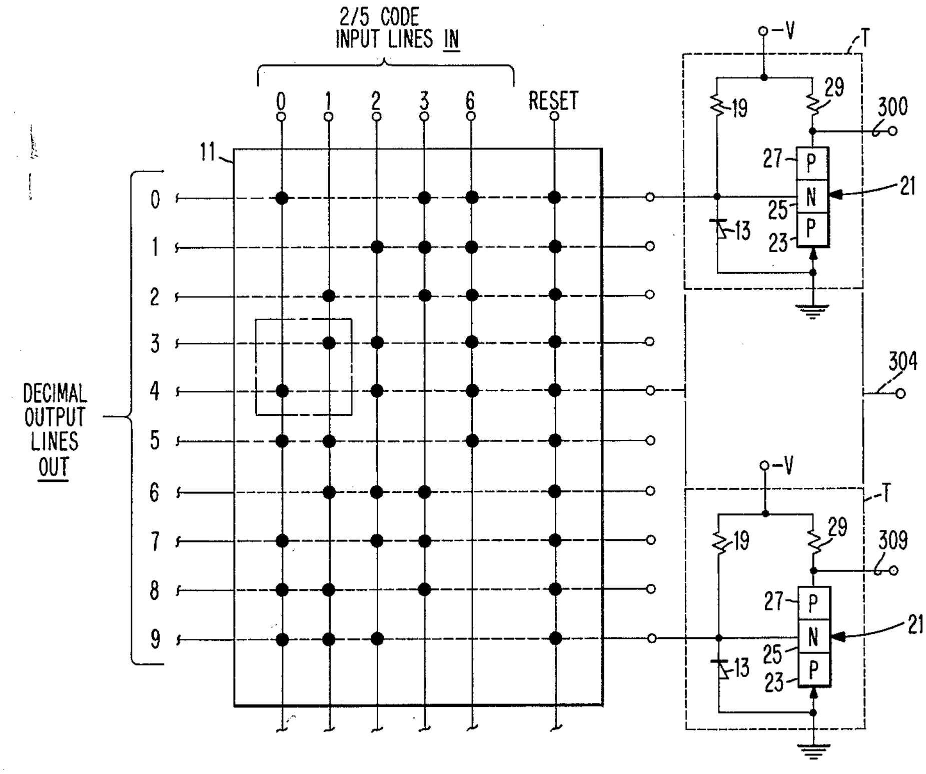

This invention relates to matrices and more particularly to an improved capacitor matrix.

It is a principal object of this invention to provide a capacitor matrix in which back currents are minimized.

It is another object of this invention to provide a capacitor matrix which utilizes tunnel diodes as logic elements.

An article in the Physical Review of January 1957 on pp. 603–605 entitled "New Phenomenon in Narrow Germanium P-N Junctions" by Leo Esaki, describes a semiconductor structure now known as the tunnel or Esaki diode. The tunnel diode may be said to be a P-N junction diode wherein both the P region and the N region contain a very high concentration of the respective impurities resulting in current versus voltage characteristics which exhibit a short circuit stable negative resistance region. The tunnel diode may also be defined as exhibiting a first region of positive resistance over a low range of potentials and, adjoining at a peak current value, a second region of negative resistance, and then a third region of positive resistance. Thus, by properly providing potentials to the tunnel diode, a bistable element may be obtained. The response time of the tunnel diode may be in the order of millimicroseconds and its operating potentials are relatively low in the order of 0.05 volt at the beginning of the negative resistance region to 0.3 to 0.8 volt, depending on the diode material used, at the end of the negative resistance region.

It is another object of this invention to provide an improved capacitor matrix in which the capacitors are formed as part of a printed or deposited circuit on printed circuit cards.

In one preferred embodiment, the invention provides a code translating matrix or array in which the input lines are selectively coupled to the output lines by capacitive coupling at cross-over points or intersections of the input lines and the output lines. A pulse coupled from an input line to an output line will drive the tunnel diode connected to the output line from one to the other of its operating states. The output lines and the input lines are coupled such that when this system is pulsed, all the complementary output lines have their respective tunnel diodes activated. The line corresponding to the non-activated diode provides the desired output.

The foregoing and other objects, features and advantages of the invention will be apparent from the following more particular description of preferred embodiments of the invention, as illustrated in the accompanying drawings.

Figures 1A, 2:
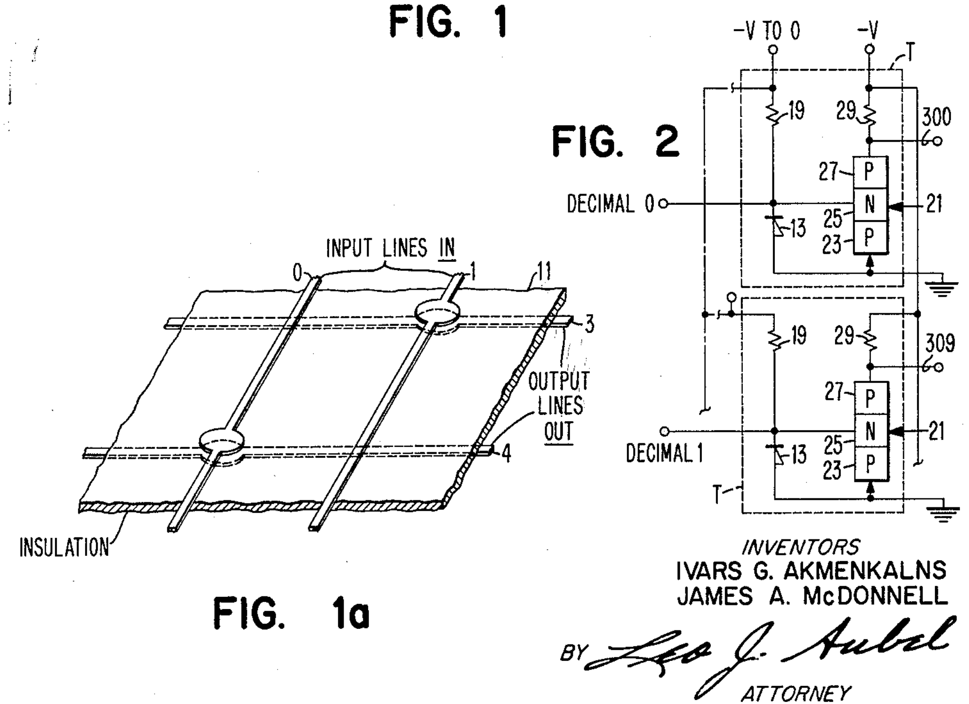
Figure 3A:
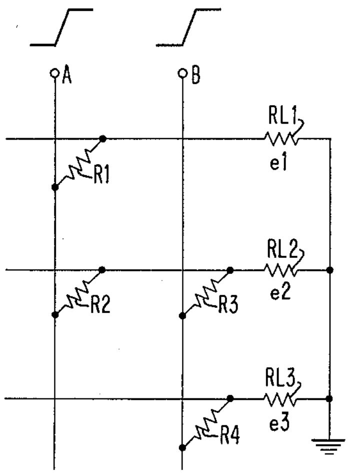
Figure 3B:
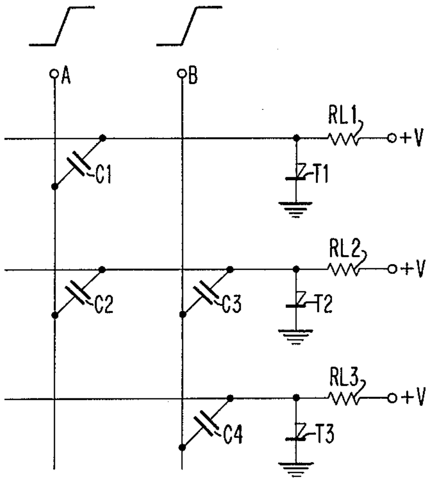
Figure 3C:
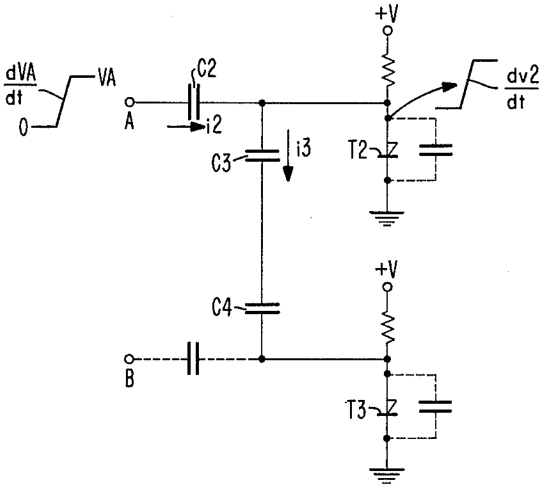

In the drawings:

FIG. 1 shows a schematic diagram of a preferred embodiment of the invention;

FIG. 1*a* is an enlarged isometric view of the dot-dashed portion of FIG. 1 showing the construction of the capacitive coupling at the intersections of the input and output lines in more detail;

FIG. 2 is a schematic diagram of an alternative circuit for connecting the tunnel diode latch circuits to the capacitor matrix of FIG. 1;

FIGS. 3*a*, 3*b* and 3*c* are sketches which are useful in explaining the operation of the circuit of FIG. 1.

FIG. 1 shows a code translating matrix or circuit formed on a printed circuit card 11. More particularly, FIG. 1 shows a matrix for translating an input signal in a 2-out-of-5 code to a decimal output code. As is known in a 2-out-of-5 code, to indicate a particular digit, 2-out-of-5 input lines labeled 0, 1, 2, 3 and 6 indicated collectively as In are energized during each signal interval. In the circuit of the invention, a 2-out-of-5 code input is translated to a decimal code in which all but one of the output lines Out, labeled individually 0–9, are energized to provide an output signal during each input signal interval.

The coupling between the input lines In to the decimal output lines Out is provided by capacitive means. As is more clearly indicated in FIG. 1*a*, the card 11 which is of insulating material has the input lines In etched, printed or deposited in the form of parallel strips on one side of the card. As noted above, the view of card 11 shown in FIG. 1*a* corresponds to the dot-dashed section of FIG. 1. The output lines Out are etched, printed or deposited as parallel strips on the opposite side of the card; the output lines Out are positioned orthogonally, i.e., transverse to the input lines In. Where a maximum capacitive coupling between the input lines In and the output lines Out is required to provide the desired code translation, the cross-sectional area of the cross-over points or intersections of both the input lines and the output lines is increased. The increased cross-sectional area where capacitive coupling is desired can be formed, that is, deposited at the same time that the input and output lines are deposited, as is known in the art. Conversely, when minimum coupling is desired, the cross-sectional area of the lines is not increased at the cross-over point.

The following table indicates a known code translation from the 2-out-of-5 code to a decimal code:

| 2-out-of-5 Code Input Lines Energized | Decimal Code Output on Indicated Line |
|---|---|
| 1 and 2 | 0 |
| 0 and 1 | 1 |
| 0 and 2 | 2 |
| 0 and 3 | 3 |
| 1 and 3 | 4 |
| 2 and 3 | 5 |
| 0 and 6 | 6 |
| 1 and 6 | 7 |
| 2 and 6 | 8 |
| 3 and 6 | 9 |

The decimal output lines Out are each coupled to similar tunnel diode latch circuits T, that is, circuits which possess "memory" to remain in a stable state to which they are switched in response to a voltage level; the latch circuits T are D.C. operated. Since all the tunnel diode circuits T are similar, only two circuit schematics are shown. As an example, the latch circuit T connected to the output line 0 will be described. The output line 0 is connected to the cathode of tunnel diode 13; the anode of diode 13 is connected to ground reference. The cathode of diode 13 is connected through a biasing resistor 19 to a source of operating potential —V; the cathode of diode 13 is also connected to the base 25 of a PNP type transistor 21. The emitter 23 of transistor 21 is connected to ground reference and the collector 27 is connected through resistor 29 to potential —V. The output from the circuit is taken from the collector 27 of transistor 21 through line 300 to a utilization circuit, not shown.

The tunnel diode 13 is thus connected across the input to transistor 21 and is used to provide a storage function and a threshold sensitive switch to drive the transistor 21. The transistor 21 provides isolation between the input and output circuits, and amplifies the voltage signal with additional power gain. As indicated above, with suitable biasing conditions, the tunnel diode 13 has two stable operating points. At one operating point, the tunnel diode 13 absorbs all the current from the bias source and transistor 21 is cut off. If a signal is provided to switch the tunnel diode 13 to the other stable operating point, a fraction of the bias current is switched into the transistor base 25 circuit to cause the transistor 21 to become conductive. A PNP transistor has been shown; however, a NPN transistor can be used with appropriate changes in voltage and device polarities.

Capacitor matrices and other passive type matrices other than diode matrices have heretofore not been extensively used because of back current problems. This problem is illustrated in FIG. 3 by using resistors as the coupling elements. A voltage signal applied at line A will cause output signals *e1* and *e2* to be generated across load resistors RL1 and RL2, respectively. However, due to the current path or circuit traceable from line A through resistors R2, R3 and R4 and load resistor RL3 to ground, a somewhat reduced and undesired signal *e3* will also be generated across load resistor RL3. In most practical applications, the problem becomes more complicated due to numerous back current paths connecting a selected output to an unselected output.

FIG. 3*b* shows a capacitor matrix that performs the same function as the matrix in FIG. 3*a* and, in addition, stores the information in tunnel diodes T1, T2 and T3. Again, a corresponding current path or circuit exists which may be traced from line A through capacitors C2, C3 and C4, and tunnel diode T3 to ground.

In accordance with the invention, by utilizing a tunnel diode as the terminating element on a capacitive matrix, close control can be exercised over back currents to thus permit economic use of low cost capacitive matrix arrays for various logical decoding operations.

As will be explained, the back current is controlled by controlling the tunnel diode voltage switching rate.

For purposes of explanation, FIG. 3*b* is redrawn as FIG. 3*c* to illustrate more clearly the back current paths for line A. The noise current *i3* is determined by the capacitance in the back circuit and the rate at which diode T2 switches.

$$i3=\frac{C3C4}{C3+C4}\left(\frac{dv2}{dt}\right)$$

where: the C's refer to the capacitance of the same numbered capacitors; V2 is the voltage applied to diode T2; and $$\frac{dv2}{dt}$$

is the rate of change of the voltage on diode T2 with respect to time.

In case of identical capacitors, this expression reduces to:

$$i3=\frac{1}{2}C\left(\frac{dv2}{dt}\right)$$

Since in most practical applications there will be *n* back current paths, the total noise current in diode T3 will be:

$$i_n=\frac{1}{2}nC\left(\frac{dv2}{dt}\right)$$

From the above, it will be appreciated that for a fixed capacitance array the noise current $i_n$ can be controlled by controlling the diode switching rate. To control the desired diode switching, one has to provide a control current *i2* such that:

$$i2>i_n$$

The control current is determined from:

$$i2=C\left(\frac{dvA}{dt}\right)$$

where $v2<<vA$; where *v*A is the drive voltage on line A; and $$\frac{dvA}{dt}$$

is the rate of change of the drive voltage on line A.

The tunnel diode switching rate can be controlled by controlling the device capacitance or adding additional external capacitance. The switching rate is essentially independent of the control current for reasonable overdrive. It is only the delay time that is decreased by an increased control current.

To provide the required conditions for proper matrix operation, the maximum allowable noise current is determined with respect to the type tunnel diode being used. The maximum number of back circuits *n* and the noise current in each back circuit is then determined from the matrix topology. Next, the maximum permissible voltage rate of change of the tunnel diode is determined from the permissible noise current and the capacitance in the back circuits; this determines the minimum effective tunnel diode capacitance. Finally, a driver minimum voltage rate of change is selected to insure sufficient control current to switch the desired diode.

In order to insure that the control current pulse has sufficient duration, the switching times of the tunnel diodes and the drivers will have to be made approximately equal.

For example referring to FIG. 3*b*, assume each tunnel diode will be used to drive a common emitter transistor switch. Assume that after considering the load requirements on the transistor a 5 ma. peak current diode is used, that a 1 ma. noise current margin exists, and that a minimum of a 2 ma. control current is required; the procedure of obtaining these parameters is known in the art.

In the circuit of FIGS. 3*b* and 3*c*, there is only one back current path and therefore the noise current will be:

$$i_n=i3=\frac{1}{2}C\left(\frac{dv2}{dt}\right)$$

Since only 1 ma. noise current can be tolerated:

$$\frac{1}{2}C\left(\frac{dv2}{dt}\right)<1\text{ ma.}$$

The drive current requirement can be stated as:

$$C\left(\frac{dvA}{dt}\right)>2\text{ ma.}$$

Note that the assumption:

$$vA>>v2$$

is used.

Since there are wide ranges of parameters possible such as of C, *dv2/dt*, *dvA/dt*, *vA*, tunnel diode and driver switching times, there are several practical solutions to the problem; for purposes of this example, voltage *v*A and $\Delta t$A were selected and the equation was solved for C.

The inequalities can be rewritten as:

$$\frac{1}{2}C\left(\frac{dv2}{dt}\right)<1\text{ ma.}<\frac{1}{2}C\left(\frac{dvA}{dt}\right)$$

$$\left(\frac{dv2}{dt}\right)<\left(\frac{dvA}{dt}\right)$$

For triggering requirements $\Delta t2\approx\Delta tA$; therefore, the only requirement is that the driver voltage change be larger than the tunnel diode voltage change.

Selecting $\Delta vA=6$ v. and $\Delta tA=0.1$ μsec.

$$C>\frac{2\text{ ma.}}{\left(\frac{\Delta vA}{\Delta tA}\right)}=\frac{2\times10^{-3}\times10^{-7}}{6}$$

$$C>.33\times10^{-10}=33\mu\mu f.$$

The tunnel diode loaded with a transistor has a voltage change given by $\Delta v2 \approx 0.3$ volt.

The noise current will be calculated to be approximately:

$$i_n = C\left(\frac{\Delta v2}{\Delta t2}\right) = (33\times 10^{-12})\left(\frac{3\times 10^{-1}}{10^{-7}}\right)$$

$$i_n = 99\times 10^{-6} \approx 0.1 \text{ ma.}$$

In this idealized case, there is a wide noise current margin and for the stated conditions up to 10 back circuits could be tolerated. The final requirement that $$t2 \approx \Delta tA = 0.1\ \mu\text{sec.}$$

is satisfied by using a tunnel diode with approximately 1000 $\mu\mu$f. effective capacitance. In practical design problems, conditions will be somewhat less favorable to variations in acceptable tolerances, that is in this case a number of back circuits less than the optimum number of 10 may be tolerated.

Thus, by using the combination of a capacitor matrix and a tunnel diode bistable circuit, a matrix is provided with the unique property of having reduced back circuit or noise currents. In contrast to other passive matrix applications, the noise currents are essentially independent of the drive current.

The operation of the matrix of FIG. 1 is as follows: The input lines are arranged to receive negative-going voltage signals in a 2-out-of-5 code. For example, assume that input lines 1 and 3 are energized in a 2-out-of-5 code which is to be translated into a decimal number 4 indication. The 1 and 3 lines of the 2-out-of-5 code are pulsed with a negative-going signal.

As can be seen from FIG. 1, a signal from either input line 1 or 3 or both couples to one of the output lines with the exception that neither input line 1 nor 3 couples to output line number 4. Thus, signals on input lines 1 and 3 set all the tunnel diodes of the latches T (except the tunnel diode connected to the output line number 4) to a relatively high voltage state; all the transistors in the associated latches T (except the transistor of the latch T connected to output line 4) will thus become conductive and provide a ground or zero potential. The tunnel diode connected to line number 4 will be at its low voltage state and the transistor coupled thereto will be non-conductive; a negative potential will be coupled to its output line 304. A resent line labeled Reset is included to provide means of resetting all tunnel diodes to the low voltage state prior to the decoding operation. This reset operation may also be used to detect the state of the decode matrix whenever a capacitively coupled load is used.

As shown in FIG. 2, an inhibit function on selected lines may be obtained by returning each tunnel diode 13 through resistor 19 to a voltage which may vary from a −V to zero volts. As indicated, the connections from each of the resistors 19 in latches T may be in common to a single line (shown dot-dashed in FIG. 2) or each resistor 19 may be connected to separate terminals. The transistor 21 in each of latches T remains connected to a reference potential −V. The inhibit function will prevent switching of any one or all of the lines as desired.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A matrix comprising a plurality of input and output lines, capacitive means selectively coupling energy from said input to said output lines, tunnel diodes each biased to have two stable operating states connected to said output lines, said input lines arranged to be energized in particular codes, each said tunnel diode being switched from one to its other stable state by energy coupled from an input line to the associated output line, said tunnel diodes enabling close control to be maintained over back currents, means connected to said tunnel diodes to provide an output signal indicative of the stable state of the associated tunnel diode, and reset means for resetting said tunnel diodes to an initial state.

2. A matrix comprising in combination, input lines formed as printed or deposited circuits on one side of an insulative board, output lines formed as printed or deposited circuits on the opposite side of said insulative board in transverse relation to said input lines, capacitive means formed at the intersection of selected ones of said input and output lines by enlarging the area of said lines at said selected intersections, tunnel diodes each biased to have an initial and a second stable state connected to said output lines, said tunnel diodes being switched from an initial to a second stable state by energy coupled from said input lines to said output lines to provide an output indicative of the input signals, said tunnel diodes each arranged to have a switching rate which is independent of the input current whereby back circuit currents in said matrix are reduced.

3. A matrix comprising a plurality of input and output lines, capacitive means selectively coupling electrical energy from said input to said output lines, tunnel diodes connected to said output lines, each of said tunnel diodes being biased to have two stable operating states, said input lines arranged to be energized in particular codes, each said tunnel diodes being switched from an initial to the other stable state by energy coupled from an input line to the associated output line, said tunnel diodes each arranged to have a switching rate which is essentially independent of the input current whereby back circuit currents are reduced, output means connected to each said tunnel diodes to provide an output signal indicative of the stable state of the associated tunnel diode, and reset means for resetting said tunnel diode to the initial state.

4. A code translating array for translating an *m*-out-of-*n* code input into a decimal code output, said array comprising *n* input lines and ten output lines, capacitive means selectively coupling electrical energy from said input to said output lines, tunnel diodes connected to said output lines each said tunnel diodes being biased to have two stable operating states connected to said output lines, said input lines arranged to be energized in particular codes, each said tunnel diodes being switched from one to the other stable state by energy coupled from an input line to the associated output line, said tunnel diodes each arranged to have a switching rate which is independent of the input current whereby back circuit currents are reduced, output means connected to said tunnel diodes to provide an output signal indicative of the stable state of the associated tunnel diode, and reset means for resetting said tunnel diode to an initial state.

5. A matrix comprising, in combination; input lines, arranged to receive an *m*-out-of-*n* code, formed as printed circuits on one side of an insulative board; output lines, arranged to provide a decimal output, formed as printed circuits on the opposite side of said insulative board in transverse relation to said input lines; capacitive means formed, at the intersection of selected ones of said input and output lines, by enlarging the area of said lines at said selected intersections; latch circuits, each including a tunnel diode arranged to have an initial and a second stable voltage state connected across the input circuit of a transistor; means for energizing said input lines in an *m*-out-of-*n* code, whereby all the lines except the one corresponding to the selected decimal output are energized to set the associated diodes to their second state to cause the associated transistors to become conductive; and whereby the transistor connected to the diode coupled to the selected line remains nonconductive to provide an output indicative of the input code; and said tunnel diodes each arranged to have a switching rate which is independent of the input current whereby back circuit currents in said matrix are reduced.

6. A matrix as in claim 5 including means for connecting said transistor and said tunnel diodes to separate operating potentials, whereby an inhibit function may be obtained on selected ones of said output lines.

References Cited in the file of this patent

UNITED STATES PATENTS

| | | |
|---|---|---|
| 3,003,143 | Beurrier | Oct. 3, 1961 |
| 3,011,156 | MacPherson | Nov. 28, 1961 |